United States Patent [19]

Driller et al.

[11] Patent Number: 4,952,871
[45] Date of Patent: Aug. 28, 1990

[54] METHOD AND APPARATUS OF TESTING PRINTED CIRCUIT BOARDS AND ASSEMBLY EMPLOYABLE THEREWITH

[75] Inventors: Hubert Driller; Paul Mang, both of Schmitten, Fed. Rep. of Germany

[73] Assignee: Mania Elektronik Automatisation Entwicklung und Gerätebau GmbH, Weilrod, Fed. Rep. of Germany

[21] Appl. No.: 469,717

[22] Filed: Jan. 24, 1990

Related U.S. Application Data

[63] Continuation of Ser. No. 401,509, Aug. 30, 1989, abandoned, which is a continuation of Ser. No. 63,658, Jun. 18, 1987, abandoned.

[30] Foreign Application Priority Data

Jun. 25, 1986 [EP] European Pat. Off. ........ 86108680.9

[51] Int. Cl.⁵ .......................... G01R 1/02; G01R 1/067
[52] U.S. Cl. ................................. 324/158 F; 324/691; 324/158 P
[58] Field of Search ............. 324/62, 72.5, 149, 158 P, 324/158 F

[56] References Cited

U.S. PATENT DOCUMENTS

| | | |
|---|---|---|
| 4,321,533 | 3/1982 | Matrone . |
| 4,471,298 | 9/1984 | Frohlich . |
| 4,496,903 | 1/1985 | Paulinski ........................ 324/73 PC |
| 4,626,776 | 12/1986 | Wilkinson ........................ 324/158 P |
| 4,626,779 | 12/1986 | Boyle ........................ 324/73 PC |

FOREIGN PATENT DOCUMENTS

| | | |
|---|---|---|
| 0115135 | 8/1984 | European Pat. Off. ........ 324/158 F |
| 2013070 | 9/1971 | Fed. Rep. of Germany . |
| 2707900 | 8/1978 | Fed. Rep. of Germany . |
| 2915742 | 10/1980 | Fed. Rep. of Germany ... 324/158 P |
| 2920226 | 11/1980 | Fed. Rep. of Germany ... 324/158 F |
| 3312436 | 5/1984 | Fed. Rep. of Germany ... 324/158 P |
| 3524229 | 1/1986 | Fed. Rep. of Germany . |
| 0120968 | 7/1984 | Japan .............................. 324/158 F |
| 80/02599 | 11/1980 | World Int. Prop. O. ...... 324/158 F |

Primary Examiner—Reinhard J. Eisenzopf
Assistant Examiner—W. Burns
Attorney, Agent, or Firm—Wenderoth, Lind & Ponack

[57] ABSTRACT

A printed circuit board having thereon a plurality of conductors including connection points is tested for insulation resistance between the conductors by measuring current flowing between one conductor and the other conductors in an arrangement whereby each connection point is connectable to a first potential through a first transistor and to a second potential through a second transistor and a current measuring device. During testing, only a single connection point of each conductor is connected to the second potential, and all other transistors of that conductor are mechanically isolated from electrical connection with respective connection points. This prevents leakage current through the transistors associated with the other connection points of a given conductor.

23 Claims, 5 Drawing Sheets

METHOD AND APPARATUS OF TESTING PRINTED CIRCUIT BOARDS AND ASSEMBLY EMPLOYABLE THEREWITH

This application is a continuation of Ser. No. 401,509, filed Aug. 30, 1989, now abandoned, which is a continuation of application Ser. No. 063,658, filed June 18, 1987, now abandoned.

BACKGROUND OF THE INVENTION

The present invention relates to a method and apparatus for testing printed circuit boards, such as printed circuit cards, ceramic circuit boards, flexible circuit boards and the like, and to an assembly employable in such method and apparatus.

The electronic testing of printed circuit boards or the like requires a number of tests to be conducted. On the one hand, it is desired to test networks or conductors on a given printed circuit board to determine conductivity of such networks or conductors by measuring conductivity from each connection point to each other connection point. On the other hand, it also is desired to measure as accurately as possible, the insulation resistance between individual networks or conductors on the printed circuit board by measuring current flowing between one network and another network or between one conductor and another conductor. Thus, it is desired to ascertain the existence of as high an insulation resistance as possible within the scope of the capabilities of the available electronic testing equipment.

Conventionally, testing of circuit boards in this manner is carried out by establishing electrical connections between connection points of the conductors on the circuit board being tested and contact elements of an array of contact elements with the aid of an adaptor assembly including a plurality of elongated test pins, with test signals being coupled selectively to each contact element of the contact array by electronic switching means such as semiconductor switches, preferably in the form of transistors such as MOS field effect devices.

One problem with this known approach is that transistors of this type do not constitute ideal switches having infinite or zero resistance. Rather, such devices have a relatively low ON resistance higher than zero and a relatively high OFF resistance lower than infinity. As a result, during the measurement of insulation resistance between any two conductors on a given circuit board, there will result the additional detection or sensing of leakage currents which flow through the transistors associated with the connection points of the particular conductor under test, since all of these transistors are connected in parallel between such conductor and ground. The sum total of these leakage currents will not cause any major inconveniences if the conductors involved are relatively short. However, as conductor length increases, the leakage currents may falsify the test result. On typical printed circuit boards, one half to two thirds of the total number of connection points are distributed along many conductors each having a relatively short length, the remainder of the connection points being distributed along conductors associated with a power supply bus and a clock signal line. These latter two conductors usually are very long and have there along a great number of connection points. This results in major problems when it is desired to measure the insulation resistance between such conductors and the other conductors, due to leakage currents caused by the transistors coupled to the connection points of such two conductors. On practical circuit boards, about 30% of the connection points may be on the ground conductor and about 15% of the power supply bus. One reason for this situation is that it is common practice to connect the unused inputs of integrated circuit modules to ground.

Accordingly, if it is desired to measure the insulation resistance between the ground conductor and any other conductor on a printed circuit board, it may be necessary to take into account up to 15,000 transistors connected in parallel in the OFF condition. The leakage currents caused by these 15,000 transistors will be added and will affect the measured test results It is known to correct for leakage currents by the use of various software. To this end, the leakage current of a "good" sample transistor is measured during programmed initialization, and the leakage current so determined is used for correcting actual measurement results. One disadvantage of this procedure is that it involves unavoidable faults so that the obtainable accuracy is rather low, taking into account the exemplary large number of 15,000 transistors connected in parallel, as indicated above. Even if a small correction error of 1% is assumed, measurements still will include the leakage currents of 150 transistors in the above example. Also, this type of software correction cannot deal with temperature gradients in the testing apparatus which may cause leakage currents to vary with location.

SUMMARY OF THE INVENTION

Accordingly, it is an object of the present invention to provide a method and apparatus, as well as an assembly employable therewith, for testing printed circuit boards, whereby it is possible to achieve precise measurements of insulation resistance between one conductor on a printed circuit board being tested, even if such conductor is relatively long, and other conductors on the printed circuit board.

This object is achieved in accordance with the method, apparatus and assembly aspects of the present invention by an arrangement whereby it is possible to prevent leakage current flow through the electric (or more precisely - electronic) switches of the connection points of a specific conductor other than a selected connection point thereof during the testing of the insulation resistance between such specific conductor and other conductors of a printed circuit board being tested. This preventing of leakage current flow is achieved, prior to performing the insulation resistance tests, i.e., the second set of tests referred to hereinafter, by mechanically interrupting electrical connection between all of the connection points of all of the conductors and the respective electric switches thereof, other than the selected connection point of each conductor and the respective electric switch thereof which is connected to the current measuring means.

A particular advantage of this feature of the present invention is that the insulation resistance between relatively long conductors and other conductors on a printed circuit board being tested may be measured in a relatively simple and uncomplicated manner by employing only one additional step after the conductors have been tested for conductivity. Particularly, it is possible in accordance with the present invention, to measure insulation resistances at the highest possible degree of sensitivity. The various structures of the present invention employed to achieve such advantages are simple in constructions and are handled easily.

In accordance with one embodiment of the present invention, a mask having therethrough openings at positions corresponding to the selected connection points of the conductors is, prior to conducting the second set of tests, positioned between the connection points of the conductors and the respective test pins of the adaptor assembly. Accordingly, only those test pins corresponding to the selected connection points extend through the openings in the mask to make electrical contact with the selected connection points, and all other of the test pins are blocked by the mask from making electrical contact with their respective connection points. Such a mask of this type is relatively simple to prepare, and in a particularly advantageous embodiment the mask is in the form of a thin sheet of electrically insulative material having therethrough the openings. The contact elements of the contact array are resiliently compressible by the respective test pins, and the thin sheet of electrically insulative material which forms the mask has a thickness of approximately 0.2 mm when the contact elements of the contact array are resiliently compressible by the test pins by a maximum stroke of from 2 to 6 mm. Preferably, this embodiment of the present invention provides an adjustable arrangement for aligning the mask with respect to the test pins and the circuit board being tested such that the test pins are aligned with the respective connection points and specifically those test pins corresponding to the selected connection points are aligned to extend through the openings in the mask.

In accordance with another preferred embodiment of the present invention, the test pins are of a resiliently compressible and extensible construction, with those test pins corresponding to the selected connection points being of a construction to be extensible to a greater length than the remainder of the test pins. Thus, during the conductivity testing, i.e. the first set of steps referred to hereinafter, electrical connections are made between all of the test pins and the respective connection points by a shifting device pressing the circuit board against all of the test pins such that the test pins are in contact with respective contact elements of the contact array. After the first set of tests, and prior to the second set of tests, the shifting device selectively moves the circuit board being tested in a direction away from the test pins, while maintaining alignment of the connection points of the circuit board with the test pins, until only those test pins which are extensible to a greater length remain in contact with the respective selected connection points, and the remainder of the test pins are spaced from and out of electrical contact with their respective connection points. The shifting device is operable to move the circuit board by a predetermined distance in the longitudinal direction of the test pins, while maintaining alignment of the circuit board with respect to the test pins, to achieve the above result.

In accordance with a further embodiment of the present invention, those contact elements of the contact array which correspond to the selected connection points are resiliently compressible with respect to the remainder of the contact elements. That is, all of the contact elements may be compressible, with those contact elements corresponding to the selected connection points being compressible to a greater extent. Additionally, it would be contemplated that only those contact elements corresponding to the selected connection points might be compressible. Furthermore, those test pins corresponding to the selected connection points are of a length greater than the remainder of the test pins, and the difference in such lengths is less than the extent of compressibility of those contact elements corresponding to the selected connection points, or to the difference in extent of compressibility between those contact elements and the remainder of the contact elements. Thus, in this embodiment of the present invention, during the first set of steps, a shifting device moves the circuit board toward the test pins such that all of the connection points are in contact with the respective test pins and all of the test pins are in contact with the respective contact elements, those test pins of greater length compressing the respective contact elements to a greater extent. After completion of the first set of tests, and before performance of the second set of tests, the shifting device moves the circuit board in a direction away from the test pins, while maintaining alignment of the connection points of the circuit board with the test pins, until only those test pins of greater length remain in electrical contact with the respective selected connection points, and the remainder of the test pins are spaced from and out of electrical contact with their respective connection points. In a particularly preferred arrangement of this embodiment of the present invention, the difference in length between the shorter and longer test pins is approximately 2 to 3 mm, assuming a maximum compressive stroke of the contact elements of approximately 4 to 8 mm. Also, all of the test pins may be of the same length, and the contact elements of the selected connection points may have a greater compressibility or spring force than the remainder of the contact elements.

In accordance with a still further embodiment of the present invention, an intermediate contact array member has therethrough, in a grid-like manner, a plurality of bores at positions corresponding to the test pins and the respective contact elements. After completion of the first set of tests, with the test pins moved out of contact with the respective contact elements of the contact array, the array member is positioned between the contact elements and the test pins with the test pins aligned with respective bores in the array member. Special contact members are positioned in those bores of the array member corresponding to the selected connection points, and these contact members contact and form electrical connections between those test pins corresponding to the selected connection points and the respective contact elements of the contact array. One advantage of this embodiment of the present invention is that the intermediate contact array member can be of relatively simple construction and can be provided with special contact members by automatic means with relative ease, since it is very easy to specify in terms of coordinates the selected positions where the special contact members are to be positioned. That is, the bores in the array member are provided at individual grid-like positions. In a particularly simple and preferred arrangement of this embodiment of the present invention, the intermediate contact array member comprises a board of insulative material having therethrough the bores, and the rigid contact members are pin-like elements having a first body portion to extend through a respective bore to make contact with a respective contact element of the contact array and a second head portion of enlarged size abutting an upper surface of the board of insulative material to prevent the pin-like member from passing completely through the bore.

BRIEF DESCRIPTION OF THE DRAWINGS

Other objects, features and advantages of the present invention will be apparent from the following detailed description of preferred embodiments thereof, taken with the accompanying drawing wherein.

DETAILED DESCRIPTION OF THE INVENTION

Figure 1:
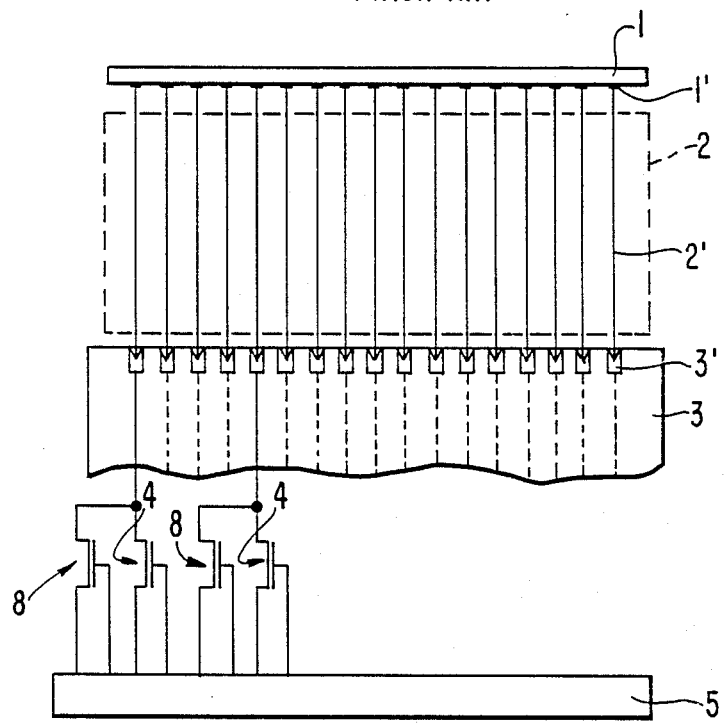
FIG. 1 is a schematic view illustrating a circuit board being tested in the prior art manner.

FIG. 1 shows a circuit board 1 being tested. Circuit board 1 has thereon a number of conductors or networks of conductors 1'' (see FIG. 2) including respective connection points 1', such as through-contacted bores or connecting pads. In a known manner, the circuit board is properly positioned with respect to test pins 2' of an adaptor assembly and is urged toward the test pins such that connection points 1' are in electrical contact with tips of respective test pins 2'. On the opposite side of adaptor assembly 2 is provided a contact array 3 including a plurality of contact elements 3', for example of a resiliently compressible construction as is known. The tips of test pins 2' opposite circuit board 1 electrically contact respective contact elements 3'. Each contact element 3' is connected to a respective controlled switching device 4, 8. For example, each switching device 4, 8 may be in the form of transistors and preferably MOS field effect transistors which are controlled selectively by known control means 5 to carry out the various steps of the testing procedure.

Figure 2:
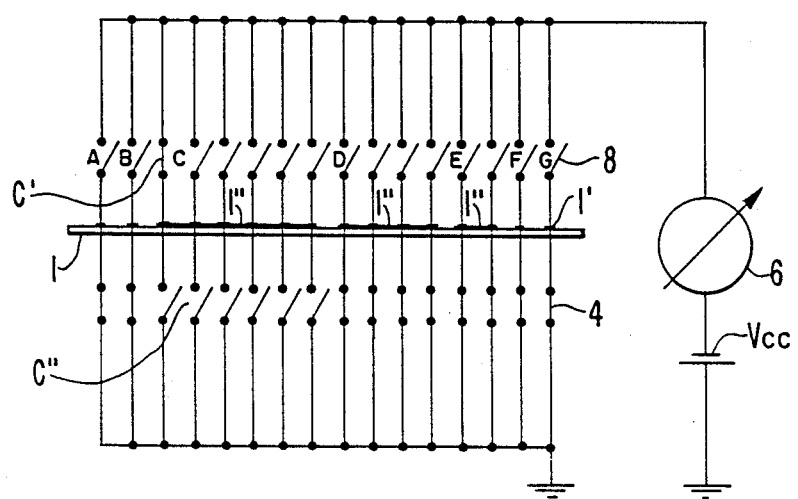
FIG. 2 is a circuit diagram schematically illustrating the known manner of conducting conductivity and insulation resistance measurements of the circuit board.

FIG. 2 illustrates the manner in which the known arrangement of FIG. 1 is employed for carrying out a first set of tests to determine the conductivity of conductors 1'' and a second set of tests to determine the insulation resistance between conductors 1''. Thus, each pad or connection point 1' on circuit board 1 is connected by control means 5 to a first potential, i.e. ground, through a respective transistor 4 and to a second potential, i.e. a test voltage $V_{CC}$, through a series connection of a respective transistor 8 and a current measuring instrument 6. For simplicity, FIG. 2 shows transistors 4, 8 as being switches. Also, FIG. 2 shows one possible example of an arrangement of networks A - G in the form of conductors 1'', with networks A, B, F, G each having a single connection pad 1', network C having six connection points 1' along the conductor 1'' thereof, network D comprising four connection points 1' along the conductor 1'' thereof, and network E having two connection points 1' along the respective conductor 1'' thereof.

During the first set of tests, each first test involves testing a respective conductor 1'' for conductivity by measuring conductivity between the connection points thereof. To this end, control means 5 controls the respective transistors 4, 8 in a manner such that during each test step only two switches are turned ON to make connection between ground and a connection point 1' through one set switch and to make connection between test voltage $V_{CC}$ and the other connection point 1' through the other of the switches. Specifically, control means 5 controls first transistor 4 of one connection point 1' of a given conductor 1'' to connect such connection point to ground, and control means 5 controls the respective transistor 8 of a second connection point 1' of the same conductor 1'' to connect such other connection point 1' to voltage source $V_{CC}$ through current measuring device 6. Control means 5 also turns OFF all other transistors 4, 8 associated with the respective conductor 1''. For example, assuming that a given first test involves testing network C for conductivity between the two left hand connection points 1' thereof, then transistors C' and C'' are turned ON to cause current to flow from ground through transistor C'', the conductive length of conductor 1'' of network C between the two left hand connection points 1', transistor C', current measuring device 6 to potential $V_{CC}$. All other transistors 4, 8 associated with network C are turned OFF. Current measuring device 6 measures this current flow and this is an indication of the relative degree of conductivity of the conductor 1'' of network C between the two left hand connection points 1' thereof.

During the second set of tests, when it is desired to test the insulation resistance between conductor 1'' of network C and other conductors 1'' of the circuit board, this is achieved by measuring current flowing between conductor 1'' of network C and the other conductors. During each such second test, a single connection point 1' of network C is connected to potential $V_{CC}$ through test instrument 6 by operation of control means 5. In the illustration of FIG. 2, this single connection point is selected as the left most connection point. All other transistors 4, 8 associated with network C are turned OFF, such that the selected connection point is isolated from ground by the respective first electric switch 4 and all remaining connection points along network C are isolated from the first and second potentials by the respective first and second electric switches, i.e. transistors 4, 8. The connection points 1' of all of the other conductors 1'' of the circuit board are connected to the first potential, i.e. to ground, through the respective first electric switches, i.e. transistors 4, as shown in FIG. 2. All of such connection points of the other conductors 1'' however are isolated from the second potential, i.e. potential $V_{CC}$, by respective of the second electric switches, i.e. transistors 8, as illustrated in FIG. 2. Thus, current flowing from ground through the closed switches 4 of the conductors of the networks other than network C through the conductor of network C and the one closed switch 8 thereof to potential $V_{CC}$ will be detected by device 6, and this will be an inverse indication of the insulation resistance between the conductor of network C and the conductors of the other networks on the circuit board being tested.

Unfortunately, however, this measurement will be falsified due to the existence of leakage current flow from all of the transistors coupled to the connection points in network C. Thus, as indicated above, transistors are not absolute switches but always will inevitably have some leakage current therethrough. This leakage current will distort the measurement of the insulation resistance.

In accordance with the present invention however, this disadvantage is overcome, and specifically such leakage current flow through the electric switches, i.e. transistors, 4 of the remaining connection points 1' along conductor 1" of the particular network, i.e. network C, will be prevented. This is achieved by, prior to performing the second set of tests, mechanically interrupting electric connection between all of the connection points and the respective switches, other than the selected one connection point of each conductor and the respective second electric switch, i.e. transistor, 8 thereof. As a result, leakage currents of transistors 4, 8 associated with the connection points 1' other than the selected single connection point of each conductor no longer will falsify the measurement of insulation resistance of that conductor. The single connection point 1' along each conductor 1" which is employed for measurement in the second test step is referred to hereinafter as the "primary point" or "selected connection point".

Figure 3:
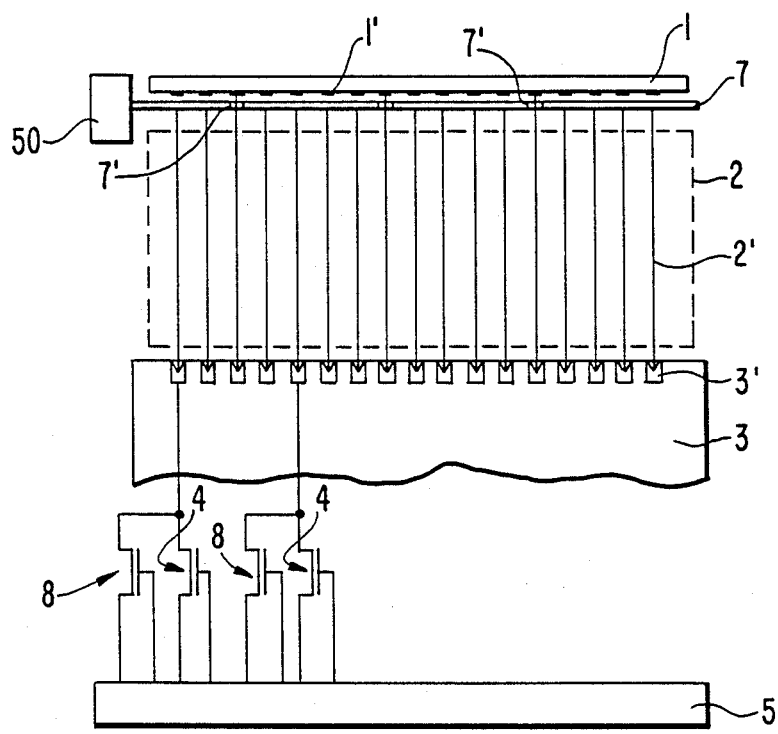
FIG. 3 is a schematic view similar to FIG. 1 but illustrating a first embodiment of the present invention.

A first embodiment of the present invention is illustrated in FIG. 3 wherein the mechanically interrupting structure is in the form of a mask 7 having therethrough openings 7' at positions aligned with those test pins 2' which correspond to the single selected connection points 1' of each of the conductors. Mask 7 is positionable selectively between test pins 2' and connection points 1' such that only those test pins 2' which correspond to the selected connection points extend through the opening 7' to make electrical contact with the selected connection points 1', and all of the other test pins are blocked by mask 7 from making electrical contact with respective connection points. Thus, mask 7 excludes during the second testing steps electrical connection between connection points 1' which are not primary points with their respective test pins. Mask 7 is introduced between circuit board 1 and adaptor assembly 2 in alignment with circuit board 1, and mask 7 of course is customized for each circuit board pattern being tested. Preferably, mask 7 is in the form of a thin sheet of electrically insulative material having a thickness of approximately 0.2 mm assuming a maximum compressive stroke of contact elements 3' of contact array 3 in the range of approximately 2 to 6 mm. Preferably, adaptor assembly 2 includes adjustment means 50 to ensure that mask 7 may be positioned quickly relative to circuit board 1 prior to performing the second set of steps, i.e. the insulation resistance measuring steps.

Figure 4A:
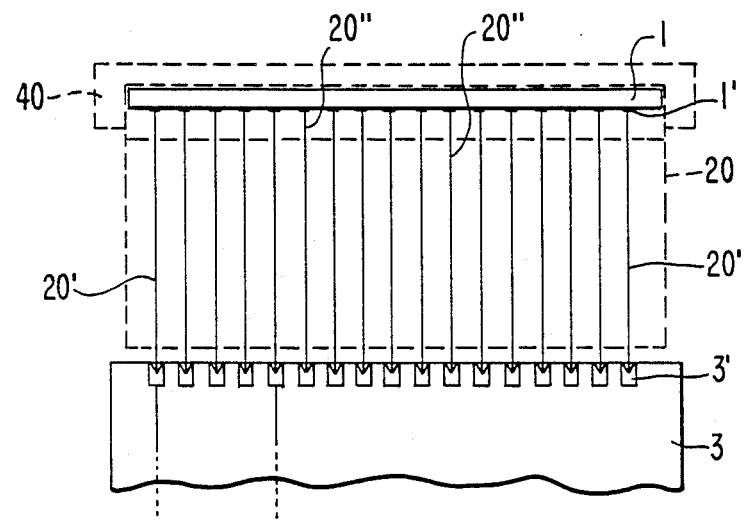
FIGS. 4a and 4b are views similar to FIG. 1 but illustrating a second embodiment of the present invention.
Figure 4B:
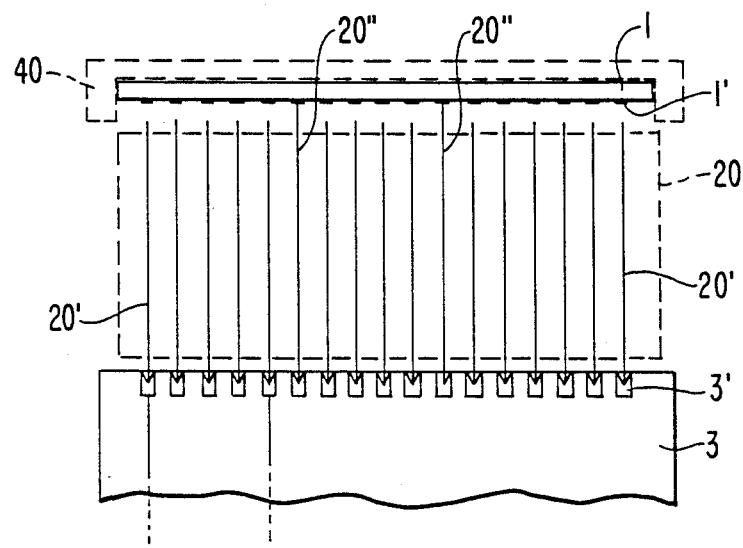

FIGS. 4a and 4b illustrate a second embodiment of the present invention which is particularly preferred and which employs an adaptor assembly 20 including test pins 20', 20" which are of resiliently compressible and extensible construction, but with test pins 20" being of a construction to be extensible to a length greater than test pins 20'. As a result, during performance of the first set of steps, as illustrated in FIG. 4a, circuit board 1 is urged downwardly, for example, by shifting means 40, so that all of connection points 1' make contact with respective test pins 20', 20". However, before conducting the second set of steps, shifting means 40 selectively moves circuit board 1 in a direction away from the test pins, while maintaining alignment of the connection points 1' of the circuit board with the respective test pins until test pins 20' are spaced from and out of electrical contact with respective of the connection points 1', but test pins 20" of greater extensible length remain in electrical contact with the respective selected connection points 1', i.e. the primary points. This embodiment of the present invention is preferable to the embodiment of FIG. 3 in that there is no need for the introduction and alignment of the mask 7 of the embodiment of FIG. 3. When it is necessary to pass from the first set of steps to the second set of steps, it is necessary only to maintain circuit board 1 in its position and to then raise it by a predetermined distance. As a result, time can be saved in conducting the tests, in comparison with the embodiment of FIG. 3.

Figure 5A:
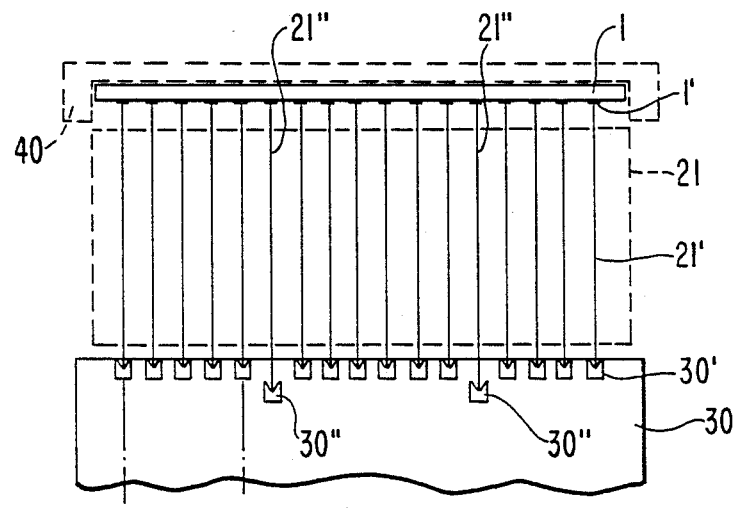
FIGS. 5a and 5b are views similar to FIG. 1 but illustrating a third embodiment of the present invention.
Figure 5B:
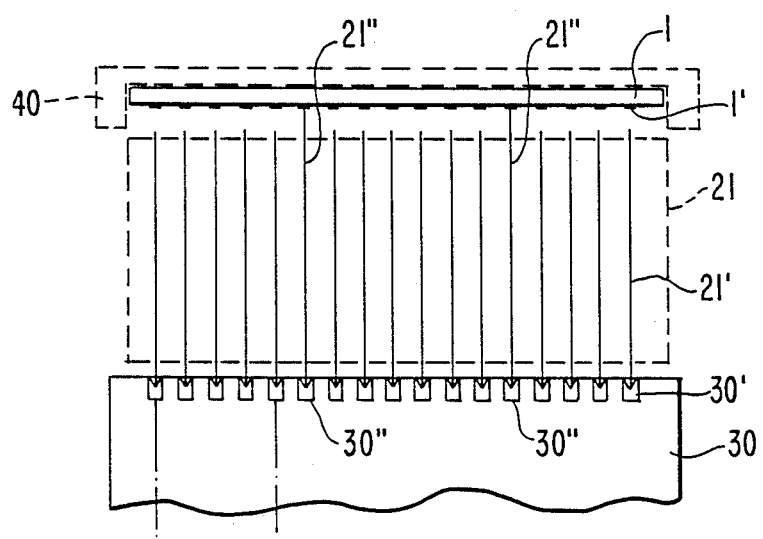

FIGS. 5a and 5b illustrate an alternative arrangement to the above discussed embodiment of FIGS. 4a and 4b. Thus, in the third embodiment of FIGS. 5a and 5b, the test pins 21', 21" are not resiliently compressible but rather are of rigid construction. However, test pins 21" corresponding to the primary points or the selected connection points are of a length greater than test pins 21'. Furthermore, the contact elements of contact array 30 are compressible to a relatively great extent. All of the contact elements may be compressible to the same extent. Alternatively, contact elements 30" corresponding to the primary points or selected connection points may be compressible to a greater degree than the remainder of the connection points 30'. The difference in length between test pins 21" and 21' is less than the extent of compressibility of all of the contact elements or less than the difference in compressibility between contact elements 30' and contact elements 30". It is contemplated that the difference in length between test pins 21" and test pins 21' is approximately 2 to 3 mm and the extent of compressibility as defined above is approximately 4 to 8 mm. The test pins are non-resilient and may be, for example, steel pins. During performance of the first set of tests, as illustrated in FIG. 5a, shifting means 40 urges circuit board 1 to the test pins until all of the connection points 1' are in electrical contact with their respective test pins, those contact elements of contact array 30 associated with longer test pins 21" being compressed to a greater extent that the remainder of the contact elements. Alternatively, all of the test pins may be of the same length, and the contact elements corresponding to the selected connection points may be more compressible or have a greater spring force than the other contact elements, such that upon moving the circuit board away from the test pins, the more compressible contact elements will maintain the respective test pins in contact with the respective connection points.

Thereafter, before conducting the second set of tests, and while maintaining alignment of the connection points of the circuit board with the test pins, shifting means 40 selectively moves circuit board 1 in a direction away from the test pins, until only test pins 21" of greater length remain in electrical contact with respective of the primary points or selected connection points 1', and the remainder of the test pins 21' are spaced from and out of electrical contact with the remainder of the connection points 1'.

Figure 6:
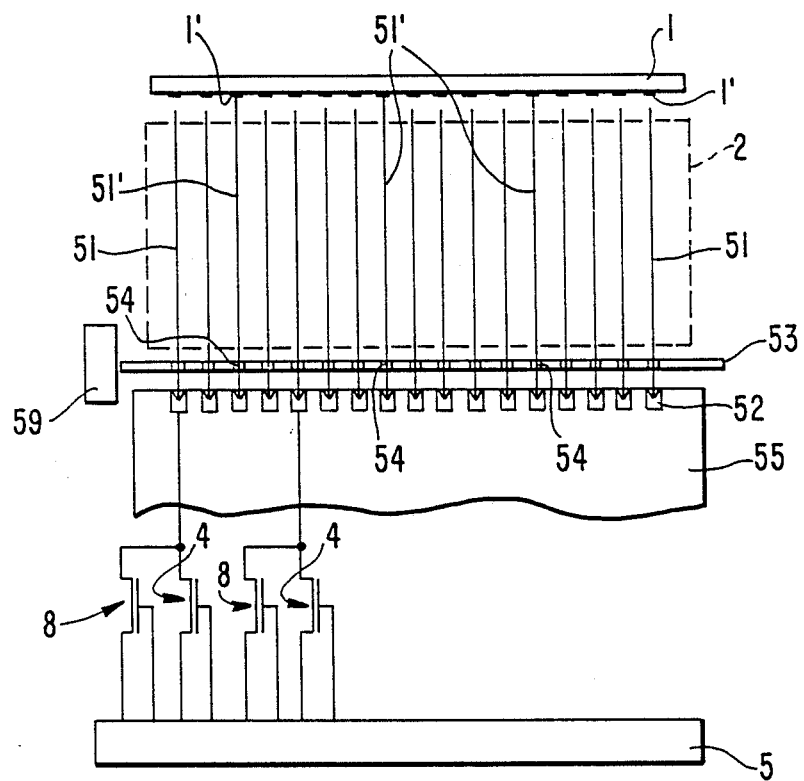
FIG. 6 is a view similar to FIG. 1 but illustrating a fourth embodiment of the present invention.
Figure 7:
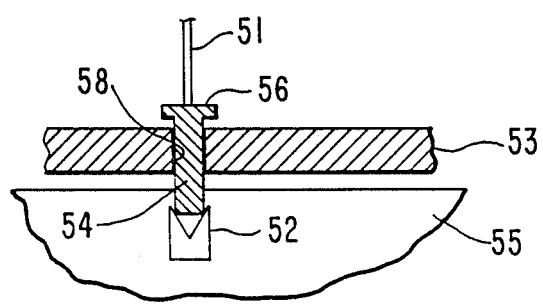
FIG. 7 is an enlarged partial cross-section illustrating a detail of the arrangement of FIG. 6.

FIGS. 6 and 7 illustrate a fourth embodiment of the present invention wherein there is provided an intermediate contact array member 53 which has therethrough, at positions corresponding to test pins 51, 51' and respective contact elements 52 of contact array 55, bores 58. After the first set of tests are performed, and prior to performance of the second set of tests, array member 53 is introduced between contact elements 52 and test pins 51, 51', with the test pins aligned with respective bores 58. This may be achieved by abutment means 59 shown schematically in FIG. 6. At this position, test pins 51' corresponding to the primary points will not make contact with contact elements 52. However, rigid contact members 54 are positioned in those bores 58 of array member 53 which correspond to the selected connection points or primary points. Contact members 54 contact the respective test pins 51' and contact elements 52, as indicated in FIG. 7, and form electrical connections therebetween. The remaining test pins, i.e. test pins 51, will pass through the respective bores 58 and make contact with the respective contact elements 52. However, test pins 51 will not make contact with the respective connection points 1' of the circuit board 1. Thus, in this embodiment also, prior to conducting the second set of test steps, electrical contact will be made between connection points 1 and contact elements 52 only at positions of the primary points, i.e. with regard to test pins 51'. As shown in FIG. 7, array member 53 may be in the form of a sheet or a board of electrically insulative material, and each contact member 54 may be in the form of a pin-like member having an elongated first body portion extending through a respective bore 58 and an integral second head portion 56 of enlarged size to abut the upper surface of board 53 to prevent the member 54 from passing completely through bore 58. During the second set of tests, electrical connections are made only between the primary points or selected connection points 1' via the selectively positioned members 54, and electrical connection with all other connection points 1' are mechanically interrupted by the non-existence of corresponding contact members 54.

An advantage of this embodiment of the present invention is that it is relatively easy to provide board 53 with contact members 54, since the positions of bores 58 and the positions where contact members 54 are to be located are easily defined in terms of a coordinate system. As a result, board 53 easily can be provided with only those required contact members 54 by suitable automatic feed means. This particularly would be a simple procedure by use of an additional thin sheet element formed of a plastic or paper material and having therethrough openings only at positions of those bores 58 of array member 53 which are aligned with those test pins at positions corresponding to primary points or the selected connection points. Thus, such sheet element may be aligned with in a grid-like manner and positioned on array member 53. Thereafter, a device such as grid cartridge having therein contact elements at each position of the grid of bores 58 is aligned with and placed on the intermediate contact array member 53. Such device then is manipulated in a manner such that the contact elements 54 are released. However, only those contact elements 54 at positions of openings in the sheet element will drop from the device into the corresponding bores 58 of the array member 53. The remainder of the contact elements 54 in the device cannot enter the bores 58 of array member 53 since the sheet element does not have openings at such positions.

Although the present invention has been described and illustrated with respect to preferred embodiments of the method, apparatus and assembly thereof, it is to be understood that various modifications and changes may be made to the specifically described and illustrated features without departing from the scope of the present invention.

What is claimed is:

1. In a method of testing a circuit board, having thereon a plurality of conductors including connection points in a testing apparatus wherein each said connection point is provided with a respective first electric switch connected to a first potential and a respective second electric switch connected to a second potential through a current measuring means, said first and second electric switches comprising semiconductor switches, and wherein an adaptor assembly includes a plurality of test pins for forming electrical connections between said connection points and respective said first and second electric switches, said testing comprising performing a first set of tests to determine conductivity of said conductors by measuring conductivity between said connection points thereof, wherein during each said first test a first said connection point along a respective said conductor is connected to said first potential through the respective said first electric switch and a second said connection point along said respective conductor is connected to said second potential through the respective said second electric switch and said current measuring means which thereby measures current flow between said first and second connection points, and said testing further comprising performing a second set of tests to determine the insulation resistance between said conductors by measuring current flowing between one said conductor and other said conductors, wherein during each said second test one selected said connection point along a specific said conductor is connected to said second potential through the respective said second electric switch and said current measuring means, essentially all the remaining said connection points along said specific conductor are isolated from said first and second potentials by respective said first and second electric switches, all connection points of each of the other said conductors are connected to said first potential through respective said first electric switches, and all said connection points of said other conductors are isolated from said second potential by respective said second electric switches, the improvement comprising preventing leakage current flow through said electric switches of said connection points along said specific conductor during said second set of tests, said preventing comprising:

prior to performing said second set of tests, mechanically interrupting electrical connection between all of said connection points of all of said conductors and the respective said electric switches thereof other than said selected connection point of each said conductor.

2. The improvement claimed in claim 1, wherein said interrupting comprises providing a mask having therethrough openings at positions corresponding to said selected connection points of said conductors, and, prior to conducting said second set of tests, positioning said mask between said connection points of said conductors and respective said test pins of said adaptor assembly, such that only those test pins corresponding to said selected connection points extend through said openings in said mask to make electrical contact with said selected connection points and all other said test points are blocked by said mask from making electrical contact with respective said connection points.

3. The improvement claimed in claim 1, comprising forming said test pins of a resiliently compressible and extensible construction with said test pins corresponding to said selected connection points of said conductors being extensible to a length greater than the remainder of said test pins, wherein during said performing of said first set of tests the circuit board being tested is moved toward said adaptor assembly until all of said test pins make electrical contact with respective said connection points, and wherein said interrupting comprises, prior to conducting said second set of tests, moving said circuit board away from said adaptor assembly, while maintaining alignment of said connection points with said test pins, until said remainder of said test pins are spaced from and out of electrical contact with respective said connection points but said test pins of greater extensible length remain in electrical contact with respective said selected connection points.

4. The improvement claimed in claim 1, comprising providing a contact array including a plurality of contact elements contacting respective said test pins and electrically connecting said test pins to respective said electrical switches, with at least those of said contact elements corresponding to said selected connection points of said conductors being resiliently compressible, providing those of said test pins corresponding to said selected connection points of said conductors of a length greater than the remainder of said test pins, the difference in length being less than the extent of compressibility of said those contact elements, wherein during said performing of said first set of tests the circuit board being tested is moved toward said adaptor assembly, whereby said those test pins compress said those contact elements, until all of said test pins make electrical contact with respective said connection points, and wherein said interrupting comprises, prior to conducting said second set of tests, moving said circuit board away from said adaptor assembly, while maintaining alignment of said connection points with said test pins, until said remainder of said test pins are spaced from and out of electrical contact with respective said connection points but said those test pins of greater length are maintained in electrical contact with respective said selected connection points by the resilience of the respective said those contact elements.

5. The improvement claimed in claim 1, comprising providing a contact array including a plurality of contact elements contacting respective said test pins and electrically connecting said test pins to respective said electrical switches, with said contact elements being resiliently compressible and with those of said contact elements corresponding to said selected connection points of said conductors being resiliently compressible to a greater extent than the remainder of said contact elements, providing all of said test pins of the same length, wherein during said performing of said first set of tests the circuit board being tested is moved toward said adaptor assembly, until all of said test pins make electrical contact with respective said connection points, and wherein said interrupting comprises, prior to conducting said second set of tests, moving said circuit board away from said adaptor assembly, while maintaining alignment of said connection points with said test pins, until said test pins corresponding to said remainder of said contact elements are spaced from and out of electrical contact with respective said connection points but said test pins corresponding to said those contact elements are maintained in electrical contact with respective said selected connection points by the greater resilience of the respective said those contact elements.

6. The improvement claimed in claim 1, comprising providing a contact array including a plurality of contact elements for contacting respective said test pins and electrically connecting said test pins to respective said electrical switches, wherein during said performing of said first set of tests all of said test pins make electrical contact with respective said contact elements, and wherein said interrupting comprises, prior to conducting said second set of tests, introducing between said test pins and said contact elements an intermediate array member interrupting electrical contact between said test pins and said contact elements, and providing said array member with contact members at positions corresponding to said selected connection points of said conductors to thereby form electrical connections between said test pins and respective said contact elements corresponding to said selected connection points.

7. In an assembly for use in testing a circuit board, having thereon a plurality of conductors including connection points in a testing apparatus including for each connection point respective first electric switch connected to a first potential and a respective second electric switch connected to a second potential through a current measuring means, said assembly including an adaptor comprising a plurality of test pins for forming electrical connections between the connection points of the conductors of the circuit board being tested and the respective first and second switches of the testing apparatus, wherein selective operation of the electric switches of the testing apparatus enables testing of the circuit board, the improvement wherein said assembly further comprises:

a contact array including a plurality of contact elements contacting respective said test pins for electrically connecting said test pins to respective electric switches of the testing apparatus; and means for selectively mechanically interrupting electrical connection between all of the connection points of all of the conductors of the circuit board being tested and the respective electric switches of the testing apparatus, except for predetermined selected such connection points and the respective electric switches, said interrupting means comprising said contact elements being of a resiliently compressible construction with those of said contact elements corresponding to the selected connection points being resiliently compressible to a greater extent that the remainder of said contact elements, and all of said test pins being of the same length.

8. The improvement claimed in claim 7, wherein said interrupting means further comprises shifting means for selectively moving the circuit board being tested in a direction away from said test pins, while maintaining alignment of the connection points of the circuit board with said test pins, until said test pins corresponding to said remainder of said contact elements are spaced from and out of electrical contact with respective connection points but said test pins corresponding to said those contact elements remain in electrical contact with respective selected connection points.

9. In an apparatus for testing a circuit board, having thereon a plurality of conductors including connection points, said testing apparatus comprising for each connection point of a circuit board being tested a respective first electric switch to be connected to a first potential and a respective second electric switch to be connected to a second potential through a current measuring means, said first and second electric switches comprising semiconductor switches, an adaptor assembly including a plurality of test pins for forming electrical connection between the connection points of the circuit board being tested and respective said first and second electric switches, and control means for selectively operating said electric witches to perform a first set of tests to determine conductivity of the conductors of the circuit board being tested by measuring conductivity between the connection points of the conductors, wherein during each said first test a first connection point along a respective conductor is connected to the first potential through the respective said first electric switch and a second connection point along the respective conductor is connected to the second potential through the respective said second electric switch and the current measuring means which thereby measures current flow between the first and second connection points, and for selectively operating said electric switches to perform a second set of tests to determine the insulation resistance between the conductors of the circuit board being tested by measuring current flowing between one conductor and the other conductors, wherein during each said second test one selected connection point along a specific conductor is connected to the second potential through the respective said second electric switch and the current measuring means, essentially all the remaining connection points along the specific conductor are isolated from the first and second potentials by respective said first and second electric switches, all connection points of each of the other conductors are connected to the first potential through respective said first electric switches, and all the connection points of the other conductors are isolated from the second potential by respective said second electric switches, the improvement comprising means for preventing leakage current flow through said electric switches of the connection points along the specific conductor during said second set of tests, said preventing means comprising:

means for, prior to performing said second set of tests, mechanically interrupting electrical connection between all of the connection points of all of the conductors and the respective said electric switches thereof, other than the selected connection point of each conductor.

10. The improvement claimed in claim 9, wherein said interrupting means comprises a mask having therethrough openings at positions aligned with those said test pins corresponding to the selected connection points of the conductors of the circuit board being tested, said mask being positionable selectively between said test pins and the connection points such that only said those test pins extend through respective said openings to make electric contact with the selected connection points and all other said test pins are blocked by said mask from making electrical contact with respective connection points.

11. The improvement claimed in claim 10, wherein said mask comprises a thin sheet of electrically insulative material.

12. The improvement claimed in claim 11, further comprising a contact array including a plurality of contact elements contacting respective said test pins for electrically connecting said test pins to respective said electrical switches, said contact elements being resiliently compressible by respective said test pins by a maximum stroke of from 2 to 6 mm, and said sheet has a thickness of approximately 0.2 mm.

13. The improvement claimed in claim 10, further comprising adjustable means for aligning said mask with respect to said test pins such that said those test pins are aligned with said openings in said mask.

14. The improvement claimed in claim 9, wherein said test pins are of a resiliently compressible and extensible construction, and said interrupting means comprises those of said test pins corresponding to the selected connection points being of a construction to be extensible to a length greater than the remainder of said test pins.

15. The improvement claimed in claim 14, wherein said interrupting means further comprises shifting means for selectively moving the circuit board being tested in a direction away from said test pins, while maintaining alignment of the connection points of the circuit board with said test pins, until said remainder of said test pins are spaced from and out of electrical contact with respective connection points but said those test pins of greater extensible length remain in electrical contact with respective selected connection points.

16. The improvement claimed in claim 9, further comprising a contact array including a plurality of contact elements contacting respective said test pins for electrically connecting said test pins to respective said electric switches, and said interrupting means comprises at least those of said contact elements corresponding to the selected connection points being of a resiliently compressible construction, and those of said test pins corresponding to the selected connection points being of a length greater than the remainder of said test pins, the different in length being less than the extent of compressibility of said those contact elements.

17. The improvement claimed in claim 16, wherein said different in length is approximately 2 to 3 mm, and said extent of compressibility is approximately 4 to 8 mm.

18. The improvement claimed in claim 16, wherein said interrupting means further comprises shifting means for selectively moving the circuit board being tested in a direction away from said test pins, while maintaining alignment of the connection points of the circuit board with said test pins, until said remainder of said test pins are spaced from and out of electrical contact with respective connection points but said those test pins of greater length remain in electrical contact with respective selected connection points.

19. The improvement claimed in claim 9, further comprising a contact array including a plurality of contact elements contacting respective said test pins for electrically connecting said test pins to respective said electric switches, and said interrupting means comprises said contact elements being of a resiliently compressible construction with those of said contact elements corresponding to the selected connection points being resiliently compressible to a greater extent that the remainder of said contact elements, and all of said test pins being of the same length.

20. The improvement claimed in claim 19, wherein said interrupting means further comprises shifting means for selectively moving the circuit board being tested in a direction away from said test pins, while maintaining alignment of the connection points of the circuit board with said test pins, until said test pins corresponding to said remainder of said contact elements are spaced from and out of electrical contact with respective connection points but said test pins corresponding to said those contact elements remain in electrical contact with respective selected connection points.

21. The improvement claimed in claim 9, further comprising a contact array including a plurality of contact elements for contacting respective said test pins for electrically connecting said test pins to respective said electric switches, and wherein said interrupting means comprises an intermediate array member having therethrough bores at positions corresponding to said test pins and respective said contact elements, said array member being positioned between said contact elements and said test pins with said test pins moved out of contact with said contact elements and with said test pins aligned with respective said bores, and contact members positioned in those said bores of said array member corresponding to the selected connection points and contacting and forming electrical connection between those said test pins and the respective said contact elements corresponding to the selected connection points.

22. The improvement claimed in claim 21, wherein said array member comprises a sheet of electrically insulative material.

23. The improvement claimed in claim 22, wherein said contact members comprise pin-like members each having a first body portion extending through a respective said bore in said sheet and a second head portion of enlarged size abutting a surface of said sheet for preventing said pin-like member from passing completely through said bore.

* * * * *